(12) United States Patent
Lu et al.

(10) Patent No.: US 12,322,670 B2
(45) Date of Patent: Jun. 3, 2025

(54) METHODS AND APPARATUS FOR PACKAGE WITH INTERPOSERS

(71) Applicant: Taiwan Semiconductor Manufacturing Co., Ltd., Hsinchu (TW)

(72) Inventors: Chun-Lin Lu, Hsinchu (TW); Kai-Chiang Wu, Hsinchu (TW); Yen-Ping Wang, Hemei Township (TW); Shih-Wei Liang, Dajia Township (TW); Ching-Feng Yang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 752 days.

(21) Appl. No.: 17/462,115

(22) Filed: Aug. 31, 2021

(65) Prior Publication Data

US 2021/0391230 A1 Dec. 16, 2021

Related U.S. Application Data

(60) Continuation of application No. 16/588,504, filed on Sep. 30, 2019, now Pat. No. 11,114,357, which is a
(Continued)

(51) Int. Cl.
*H01L 21/48* (2006.01)
*H01L 21/56* (2006.01)
(Continued)

(52) U.S. Cl.
CPC ............ *H01L 23/24* (2013.01); *H01L 21/481* (2013.01); *H01L 21/4885* (2013.01); *H01L 21/563* (2013.01); *H01L 23/49816* (2013.01); *H01L 23/49827* (2013.01); *H01L 25/105* (2013.01); *H05K 1/181* (2013.01); *H01L 24/48* (2013.01); *H01L 24/73* (2013.01); *H01L 2224/16225* (2013.01); *H01L 2224/26175* (2013.01);
(Continued)

(58) Field of Classification Search
CPC ............... H01L 2924/15311; H01L 2225/1058
See application file for complete search history.

(56) References Cited

U.S. PATENT DOCUMENTS 5,969,461 A 10/1999 Anderson et al.
6,653,720 B2 11/2003 Kameda
(Continued)

FOREIGN PATENT DOCUMENTS

CN      1436368 A     8/2003
CN     102237281 A   11/2011

*Primary Examiner* — Xiaoming Liu
(74) *Attorney, Agent, or Firm* — Slater Matsil, LLP

(57) ABSTRACT

An interposer may comprise a metal layer above a substrate. A dam or a plurality of dams may be formed above the metal layer. A dam surrounds an area of a size larger than a size of a die which may be connected to a contact pad above the metal layer within the area. A dam may comprise a conductive material, or a non-conductive material, or both. An underfill may be formed under the die, above the metal layer, and contained within the area surrounded by the dam, so that no underfill may overflow outside the area surrounded by the dam. Additional package may be placed above the die connected to the interposer to form a package-on-package structure.

20 Claims, 4 Drawing Sheets

Related U.S. Application Data division of application No. 15/958,949, filed on Apr. 20, 2018, now Pat. No. 10,522,437, which is a continuation of application No. 15/335,260, filed on Oct. 26, 2016, now Pat. No. 9,966,321, which is a division of application No. 13/706,593, filed on Dec. 6, 2012, now Pat. No. 9,497,861.

(51) Int. Cl.

| | | |
|---|---|---|
| *H01L 23/24* | (2006.01) | |
| *H01L 23/498* | (2006.01) | |
| *H01L 25/10* | (2006.01) | |
| *H05K 1/18* | (2006.01) | |
| *H01L 23/00* | (2006.01) | |

(52) U.S. Cl.
CPC ............ *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/92125* (2013.01); *H01L 2225/1023* (2013.01); *H01L 2225/1058* (2013.01); *H01L 2924/15311* (2013.01); *H01L 2924/15331* (2013.01); *H01L 2924/18161* (2013.01); *H05K 2201/049* (2013.01); *H05K 2201/10378* (2013.01); *H05K 2201/10515* (2013.01); *H05K 2201/10734* (2013.01); *H05K 2201/2036* (2013.01); *Y02P 70/50* (2015.11)

(56) References Cited

U.S. PATENT DOCUMENTS

| | | | |
|---|---|---|---|
| 7,355,126 B2 | 4/2008 | Nishikawa et al. | |
| 7,880,276 B2 | 2/2011 | Nishimura et al. | |
| 8,187,921 B2 | 5/2012 | Yim et al. | |
| 8,399,300 B2 | 3/2013 | Lee et al. | |
| 8,441,123 B1 | 5/2013 | Lee et al. | |
| 9,030,030 B2 | 5/2015 | Lee et al. | |
| 9,497,861 B2 * | 11/2016 | Lu | H01L 21/4885 |
| 11,114,357 B2 * | 9/2021 | Lu | H01L 21/481 |
| 2003/0193092 A1 | 10/2003 | Tan et al. | |
| 2006/0220259 A1 | 10/2006 | Chen et al. | |
| 2007/0045870 A1 | 3/2007 | Kuramochi | |
| 2008/0179738 A1 * | 7/2008 | Nishimura | H01L 25/0655 |
| | | | 257/737 |
| 2009/0154128 A1 | 6/2009 | Tamadate | |
| 2009/0250810 A1 | 10/2009 | Pendse | |
| 2010/0078791 A1 | 4/2010 | Yim et al. | |
| 2011/0074015 A1 | 3/2011 | Suzuki | |
| 2011/0095418 A1 | 4/2011 | Lim et al. | |
| 2011/0115083 A1 | 5/2011 | Zang et al. | |
| 2011/0133321 A1 * | 6/2011 | Ihara | H01L 24/33 |
| | | | 257/676 |
| 2011/0156264 A1 | 6/2011 | Machida | |
| 2011/0210436 A1 | 9/2011 | Chow et al. | |
| 2011/0260338 A1 | 10/2011 | Lee et al. | |
| 2011/0275177 A1 | 11/2011 | Yim et al. | |
| 2012/0049355 A1 | 3/2012 | Hosokawa et al. | |
| 2012/0068353 A1 | 3/2012 | Huang et al. | |
| 2012/0159118 A1 | 6/2012 | Wong et al. | |
| 2012/0270370 A1 | 10/2012 | Ihara | |
| 2012/0319300 A1 | 12/2012 | Kim et al. | |
| 2013/0270717 A1 * | 10/2013 | Ko | H01L 25/065 |
| | | | 257/777 |
| 2014/0021598 A1 * | 1/2014 | Sutardja | H01L 24/73 |
| | | | 257/692 |
| 2014/0061893 A1 * | 3/2014 | Saeidi | H01L 23/562 |
| | | | 438/122 |
| 2014/0103536 A1 | 4/2014 | Yokoyama et al. | |
| 2014/0160688 A1 | 6/2014 | Lu et al. | |
| 2017/0047261 A1 | 2/2017 | Lu et al. | |

* cited by examiner

METHODS AND APPARATUS FOR PACKAGE WITH INTERPOSERS

CROSS REFERENCE TO RELATED APPLICATION

This application is a continuation of U.S. patent application Ser. No. 16/588,504, filed on Sep. 30, 2019, which is a division of U.S. patent application Ser. No. 15/958,949 filed on Apr. 20, 2018, now U.S. Pat. No. 10,522,437, issued on Dec. 31, 2019, which is a continuation of U.S. patent application Ser. No. 15/335,260, filed on Oct. 26, 2016, now U.S. Pat. No. 9,966,321 issued on May 8, 2018, which is a division of U.S. patent application Ser. No. 13/706,593 entitled "Methods and Apparatus for Package with Interposers," filed on Dec. 6, 2012, now U.S. Pat. No. 9,497,861 issued on Nov. 15, 2016, which applications are hereby incorporated by reference herein.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. These smaller electronic components also require smaller packages that utilize less area than previous packages. Some smaller types of packages for semiconductor devices include quad flat pack (QFP), pin grid array (PGA), ball grid array (BGA), flip chips (FC), three dimensional integrated circuits (3DICs), wafer level packages (WLPs), and package on package (PoP) devices.

A 3DIC may be formed by stacking two IC dies on top of each other to achieve a smaller size package. One type of 3DIC is the package-on-package (PoP) structure, wherein multiple dies coupled to respective substrates can be stacked on top of each other. A first die is electrically coupled to a first substrate to form a first circuit. The first circuit includes first connection points for connecting to a second circuit. The second circuit includes a second die and a second substrate having connection points on each side of the substrate. The first circuit is stacked and electrically coupled on top of the second circuit to form the PoP structure. The PoP structure can then be electrically coupled to a PCB or the like using electrical connections.

Another type of 3DIC is formed using a silicon interposer substrate (either passive or active) to provide much finer die-to-die interconnections, thereby increasing performance and reducing power consumption. In these situations, power and signal lines may be passed through the interposer by way of through vias (TVs) in the interposer. For example, two dies are bonded on top of each other with the lower die being coupled to the interposer using contact pads located on the interposer. The contact pads can then be electrically coupled to a printed circuit board (PCB) or the like using electrical connections.

In a 3DIC package, an underfill material may be used between a die and a substrate or an interposer to strengthen the attachment of the die to the substrate or the interposer to help to prevent the thermal stresses from breaking the connections between the die and substrate or interposer. However, the underfill material may overflow or bleed to connectors such as BGA balls, causing warp on the interposer and disrupting electrical connections. Methods and apparatus are needed to prevent underfill materials to overflow or bleed on BGA balls while forming semiconductor packages.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

As will be illustrated in the following, methods and apparatus for an interposer with a dam, which may be used in packaging dies, are disclosed. An interposer may comprise a metal layer on a substrate. A dam or a plurality of dams may be formed on the metal layer. A dam surrounds an area of a size larger than a size of a die which may be connected to a contact pad on the metal layer within the area. A dam may comprise a metal material, or a non-conductive material. An underfill may be formed under the die, above the metal layer, and contained within the area surrounded by the dam, so that no underfill may overflow outside the area surrounded by the dam.

Figure 1A:
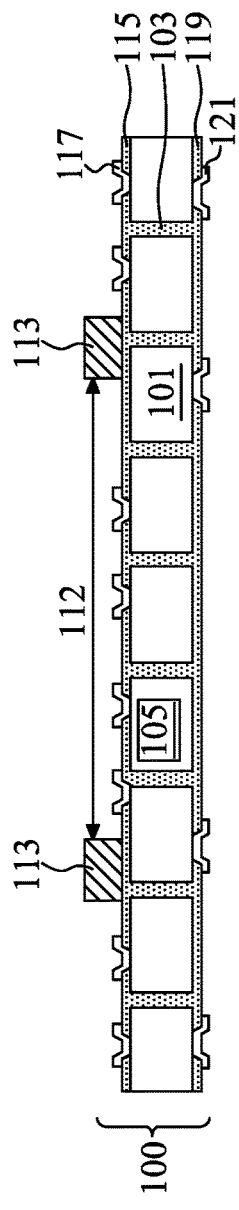
FIGS. 1(a)-1(c) illustrate cross-sectional views of an embodiment of an interposer with a dam and a package formed with the interposer.

FIG. 1(a) illustrates a cross-sectional view of an interposer 100. The interposer 100 comprises a substrate 101. A plurality of through vias (TVs) 103 may be formed through the substrate 101. A plurality of devices 105, either active or passive, may be formed within the substrate 101 as well. A first metal layer 115 may be formed on a first side of the substrate 101. First contact pads 117 may be formed on the first metal layer 115. A second metal layer 119 and second contact pads 121 may be formed over a second side of the substrate 101. While layers 115 and 119 are shown schematically as a single continuous layer, one skilled in the art will recognize that this represents various interconnects formed as distinct features within a common layer. A dam 113 may be formed on the first metal layer 115, surrounding an area 112. A contact pad may be located within the area 112 and another contact pad may be located outside the area 112, which are not shown. There may be other layers such as a passivation layer, or a polymer layer formed below the first metal layer 115, which are not shown. Each of these structures is discussed in greater detail in the following paragraphs.

As illustrated in FIG. 1(a), the substrate 101 for the interposer 100 may be, e.g., a silicon substrate, doped or undoped, or an active layer of a silicon-on-insulator (SOI) substrate, used to provide support for the interposer 100. However, the substrate 101 may alternatively be a glass substrate, a ceramic substrate, a polymer substrate, or any other substrate that may provide a suitable protection and/or interconnection functionality. These and any other suitable materials may alternatively be used for the substrate 101.

A plurality of devices 105 may be formed within the substrate 101. As one of ordinary skill in the art will recognize, a wide variety of active devices and passive devices such as transistors, capacitors, resistors, inductors and the like may be used to generate the desired structural and functional requirements of the design for the interposer 100. The devices 105 may be formed using any suitable methods either within or else on the surface of the substrate 101.

However, as one of ordinary skill will recognize, the above described substrate 101 with devices 105 is not the only substrate that may be used. Alternative substrates, such as a package substrate or an interposer that does not have devices therein, may alternatively be utilized. These substrates and any other suitable substrates may alternatively be used and are fully intended to be included within the scope of the present embodiments.

Additional metallization layers may be formed over the substrate 101 and the devices 105 to connect the various devices to form functional circuitry. Contact pads may be formed over and in electrical contact with the metallization layers. Furthermore, passivation layers may be formed on the substrate 101 over the metallization layers and the contact pads. Additional polymer layer may be formed on the passivation layer. All those metallization layers, contacts, passivation layers, and polymer layers are not shown in FIG. 1(a).

A plurality of TVs 103 may be formed through the substrate 101. The TVs 103 may be formed by applying and developing a suitable photoresist, and then etching the substrate 101 to generate TV openings. The openings for the TVs 103 at this stage may be formed so as to extend into the substrate 101 to a depth at least greater than the eventual desired height of the finished interposer 100. Accordingly, while the depth is dependent upon the overall design of the interposer 100, the depth may be between about 1 μm and about 700 μm below the surface on the substrate 101, with a preferred depth of about 50 μm. The openings for the TVs 103 may be formed to have a diameter of between about 1 μm and about 100 μm, such as about 6 μm.

Once the openings for the TVs 103 have been formed, the openings for the TVs 103 may be filled with, e.g., a barrier layer and a conductive material. The barrier layer may comprise a conductive material such as titanium nitride, although other materials, such as tantalum nitride, titanium, or the like may alternatively be utilized. The barrier layer may be formed using a chemical vapor deposition (CVD) process, such as plasma enhanced CVD (PECVD). However, other alternative processes may alternatively be used. The barrier layer may be formed so as to contour to the underlying shape of the opening for the TVs 103.

The conductive material for the TVs 103 may comprise copper, although other suitable materials such as aluminum, alloys, combinations thereof, and the like, may alternatively be utilized. The conductive material may be formed by depositing a seed layer and then electroplating copper onto the seed layer, filling and overfilling the openings for the TVs 103. Once the openings for the TVs 103 have been filled, excess barrier layer and excess conductive material outside of the openings for the TVs 103 may be removed through a grinding process such as chemical mechanical polishing (CMP), although any suitable removal process may be used.

Once the conductive material is within the openings for the TVs 103, a thinning of the second side of the substrate 101 may be performed in order to expose the openings for the TVs 103 and to form the TVs 103 from the conductive material that extends through the substrate 101. In an embodiment, the thinning of the second side of the substrate 101 may leave the TVs 103 intact. The thinning of the second side of the substrate 101 may be performed by a planarization process such as CMP or etching.

However, as one of ordinary skill in the art will recognize, the above described process for forming the TVs 103 is merely one method of forming the TVs 103, and other methods are also fully intended to be included within the scope of the embodiments.

Alternatively, the TVs 103 may be formed to extend through layers of the interposer 100 located over the substrate 101 such as the first metal layer 115 (described further below). For example, the TVs 103 may be formed either after the formation of the first metal layer 115 or else even partially concurrently with the first metal layer 115. For example, the openings for the TVs 103 may be formed in a single process step through both the first metal layer 115 and the substrate 101. Alternatively, a portion of the openings for the TVs 103 may be formed and filled within the substrate 101 prior to the formation of the first metal layer 115, and subsequent layers of the openings for the TVs 103 may be formed and filled as each of the first metal layer 115 are individually formed. Any of these processes, and any other suitable process by which the TVs 103 may be formed, are fully intended to be included within the scope of the embodiments.

The first metal layer 115 may be formed over the first side of the substrate 101 to interconnect the first side of the substrate 101 to external devices on the second side of the substrate 101. The first metal layer 115 may be a redistribution layer (RDL). While illustrated in FIG. 1(a) as a single layer of interconnects, the first metal layer 115 may be formed of alternating layers of conductive material and may be formed through any suitable process (such as deposition, damascene, dual damascene, etc.). In an embodiment there may be one or more layers of metallization, but the precise number of layers within the first metal layer 115 is dependent at least in part upon the design of the interposer 100.

The first contact pads 117 may be formed over and in electrical contact with the first metal layer 115. The first contact pads 117 may comprise a layer of conductive material such as aluminum, but other materials, such as copper, titanium, or nickel may alternatively be used. The first contact pads 117 may be formed as an under-bump-metallurgy (UBM) layer. The first contact pads 117 may comprise a plurality of contact pads as shown in FIG. 1(a). Some of the contact pads may be located within the area 112, while some other contact pads 117 may be located outside the area 112. The first contact pads 117 may be formed using a deposition process, such as sputtering, to form a layer of material (not shown) and portions of the layer of material may then be removed through a suitable process (such as photolithographic masking and etching) to form the first contact pads 117. However, any other suitable process, such as forming an opening, depositing the material for the first contact pads 117, and then planarizing the material, may be utilized to form the first contact pads 117. The first contact pads 117 may be formed to have a thickness of between about 0.5 µm and about 4 µm, such as about 1.45 µm. The first contact pads 117 may comprise multiple sub-layers, not shown.

The second metal layer 119 may be formed over the second side of the substrate 101 to interconnect the second side of the substrate 101 to external contacts. The second metal layer 119 may be a redistribution layer (RDL). While illustrated in FIG. 1(a) as a single layer of interconnects, the second metal layer 119 may be formed of alternating layers of conductive material and may be formed through any suitable process (such as deposition, damascene, dual damascene, etc.). In an embodiment there may be one or more layers of metallization, but the precise number of layers within the second metal layer 119 depends at least in part upon the design of the interposer 100.

The second contact pads 121 may be formed over and in electrical contact with the second metal layer 119 on the second side of the substrate 101. The second contact pads 121 may comprise aluminum, but other materials, such as copper, may alternatively be used. The second contact pads 121 may be formed as an under-bump-metallurgy (UBM) layer. The second contact pads 121 may comprise a plurality of contact pads. The second contact pads 121 may be formed using a deposition process, such as sputtering, to form a layer of material (not shown) and portions of the layer of material may then be removed through a suitable process (such as photolithographic masking and etching) to form the second contact pads 121. However, any other suitable process, such as forming an opening, depositing the material for the second contact pads 121, and then planarizing the material, may be utilized to form the second contact pads 121. The second contact pads 121 may be formed to have a thickness of between about 0.5 µm and about 4 µm, such as about 1.45 µm.

Figure 1B:
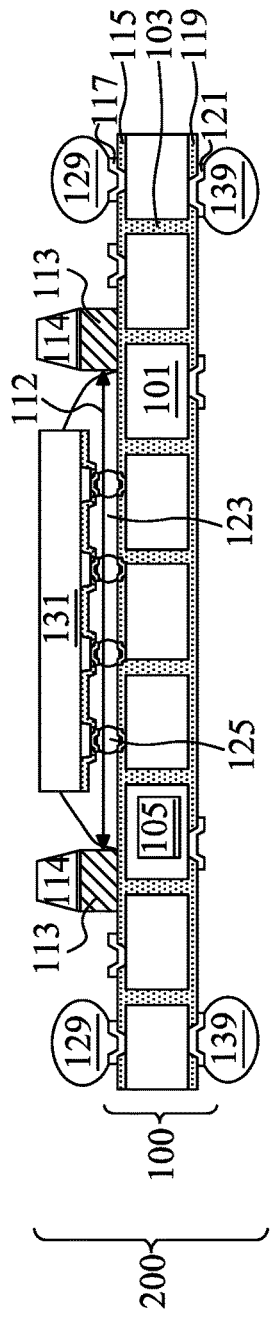

A dam 113 may be formed on the first metal layer 115, or on an insulating or passivating layer formed on first metal layer 115. The dam 113 surrounds an area 112, where the area 112 has a size that is bigger than a size of a die so that the die may be placed within the area 112 and packaged with the interposer 100, as illustrated in FIG. 1(b). In cross section view, two segments of the dam 113 are shown in FIG. 1(a). The overall dam together with the die placed in the area 112 may be illustrated in FIG. 2(a) or FIG. 2(b) in top view.

The dam 113 may comprise a conductive metal material such as aluminum, but other materials, such as copper, titanium, or nickel may alternatively be used. The dam 113 may comprise a layer of metal material and another layer of non-metal material, as shown in FIG. 1(b). When the dam 113 comprises a metal material, the dam 113 may be formed using a deposition process, such as sputtering, to form a layer of material (not shown) and portions of the layer of material may then be removed through a suitable process (such as photolithographic masking and etching) to form the dam 113. The dam 113 may be formed at the same time as the first contact pads 117. The dam 113 may be formed as part of an under-bump-metallurgy (UBM) layer, just as the first contact pads 117. It may be possible that the dam 113 is formed on a contact pad 117. In addition, any other suitable process, such as forming an opening, depositing the material for the dam 113, and then planarizing the material, may be utilized to form the dam 113. The positions and sizes of the dam 113 will be illustrated and discussed in FIG. 1(c).

The dam 113 surrounds a die that is packaged on the interposer and controls the shape of the edge of an underfill under the die.

The width, height, or diameter of the dam 113 may be about the same as the connector such as a ball (or bump) diameter, or can be as much as ⅒ of the size of the diameter of the connector such as the ball (or bump) diameter. For example, the dam 113 may be of a rectangle shape with a width around 100 um-200 um, and a height in a range from about 20 um to about 30 um. The height of the dam 113 may be of a similar size of the connector 129, which may be of a diameter size about 200 um. The dam 113 may have a narrow, wide, or tapered shape. The dam 113 body may be of a substantially constant thickness. The dam 113 may be of other shapes such as a circle, an octagon, a rectangle, an elongated hexagon with two trapezoids on opposite ends of the elongated hexagon, an oval, a diamond.

FIG. 1(b) illustrates a flip-chip package 200 where a die 131 is packaged with the interposer 100 within the area 112 surrounded by the dam 113. In packaging the die 131, the die 131 is flipped so that connectors 125 contact a plurality of first contact pads 117 on the substrate 101 within the area 112. An underfill 123 is filled under the die 131 and between the die 131 and the surface of the first metal layer 115, in the area 112 surrounded by the dam 113. A dam 114 may be further formed of non-conductive material and placed on the dam 113. A plurality of connectors 129 may be placed on the first contact pads 117 outside the area 112 to connect to other packages to further form a PoP structure. A plurality of connectors 139 may be placed on the second contact pads 121 to connect, e.g., to a PCB.

The die 131 may be an integrated circuit chip formed from a semiconductor wafer. The die 131 may be any suitable integrated circuit die for a particular application. For example, the die 131 may be a memory chip, such as a DRAM, SRAM, or NVRAM, or a logic circuit.

The connectors 125 may provide connections between the first contact pads 117 and the die 131. The connectors 125 may be contact bumps such as micro-bumps or controlled collapse chip connection (C4) bumps and may comprise a material such as tin, or other suitable materials, such as silver or copper. In an embodiment in which the connectors 125 are tin solder bumps, the connectors 125 may be formed by initially forming a layer of tin through any suitable method such as evaporation, electroplating, printing, solder transfer, ball placement, etc., to a preferred thickness of about 100 µm. Once a layer of tin has been formed on the structure, a reflow may be performed in order to shape the material into the desired bump shape.

The underfill 123 between the die 131 and the surface of the first metal layer 115 strengthens the attachment of the die 131 to the interposer 100 and helps to prevent the thermal stresses from breaking the connections between the die 131 and the interposer 100. Generally, the material for the underfill 123, such as organic resin, is selected to control the coefficient of thermal expansion and the shrinkage of underfill 123. Initially, liquid organic resin is applied that flows into the gap between the die 131 and the surface of the first metal layer 115, which subsequently cures to control the shrinkage that occurs in underfill during curing.

As shown in FIG. 1(b), the distribution of underfill 123 is relatively uniform under the die 131. However, the underfill 123 may flow over to other areas beyond the die area without control or support. The dam 113 may prevent the overflowing of the underfill and confine the underfill 123 to the area 112 defined by the dam 113. To form the underfill 123, a measured amount of underfill is applied to flow under die 131 and fill a volume defined by the dam 113. In one embodiment, the volume of the underfill 123 and the separation between the dam 113 and the die 131 are set according to the natural flow of the organic underfill 123 and the cure schedule during fabrication of device 200. In particular, the volume of underfill 123 and the height, width of the dam 113, and the separation between the dam 113 and the die 131 should provide total filling of the volume under die 131, and no or substantially no underfill material 123 may flow out over the dam 113.

As shown in FIG. 1(b), a second dam 114 formed of non-conductive material may be placed on first dam 113 when the height of the first dam 113 is not high enough to stop the overflow of the underfill 123. The second dam 114 may be formed of a variety of non-conductive materials including but not limited to a dispensed organic isolative material such as benzotriazole (BT) or modified silicone, a thermo setting mold compound such as epoxy creasol novolac (ECN) or a modified BT, or a thermo plastic compound such as polyethyl sulfone (PES) polycarbonate or polysulfone. A non-conductive dam material may be deposited on the first dam 113 and form a desired shape. The second dam 114 may be formed using a variety of techniques such as liquid dispense methods, injection transfer molding, and thermocompression transfer molding. The use of dams formed of non-conductive material together with the metal materials formed on the interposer can make the packaging more flexible, to adjust to different height and volume of the underfill material used in the packaging process.

A plurality of connectors such as solder balls 129 and 139 may be formed on the first contact pads 117 and the second contact pads 121 respectively. The connectors 129 may be used to connect to another package, such as a package 300 shown in FIG. 3. The connectors 139 may be used to connect to a PCB. The number of connectors such as 129 and 139 are only for illustrative purposes, and is not limiting. A connector may be any connection devices such as a solder ball providing an electronic connection. A plurality of connectors such as solder balls 139 or 129 may be arranged in a ball grid array, form the terminals of packaged device and can be attached to a PCB or other circuitry.

Figure 1C:
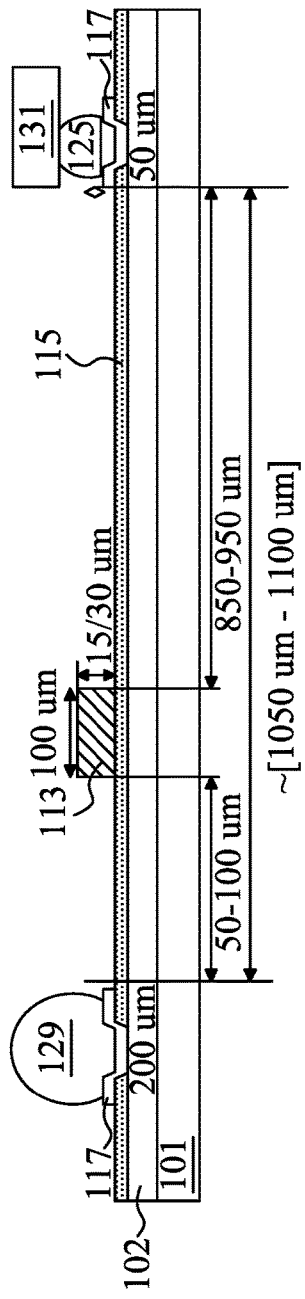

FIG. 1(c) illustrates an embodiment of the relative positions and sizes of the dam 113, the location of the die 131, and the location of connectors 129. The layer 101 is the substrate as illustrated in FIG. 1(a) and FIG. 1(b). The layer 102 may be a representation of a plurality of layers such as metallization layers, contacts, passivation layers, and polymer layers which are not shown in FIG. 1(a). The first metal layer 115 is as shown in FIG. 1(a). The die 131 is connected to a connector 125 such as a micro-bump, whose diameter may be around 50 um. The dam 113 may be of a rectangle shape with a width around 100 um, and a height in a range from about 15 um to about 30 um. The connector 129 may be of a diameter size about 200 um. The distance between the dam 113 and the connector 129 may be in a range from about 50 um to about 100 um. The distance between the connector 125 to the connector 129 may be in a range from about 1050 um to about 1100 um. The distance between the dam 113 to the connector 125 may be in a range from about 850 um to about 950 um. The measurements shown in FIG. 1(c) are only for illustration purposes and are not limiting. With the continuous reduction of feature sizes and package sizes, the measurements in other embodiments may become smaller than the ones shown in FIG. 1(c).

Figure 2B:
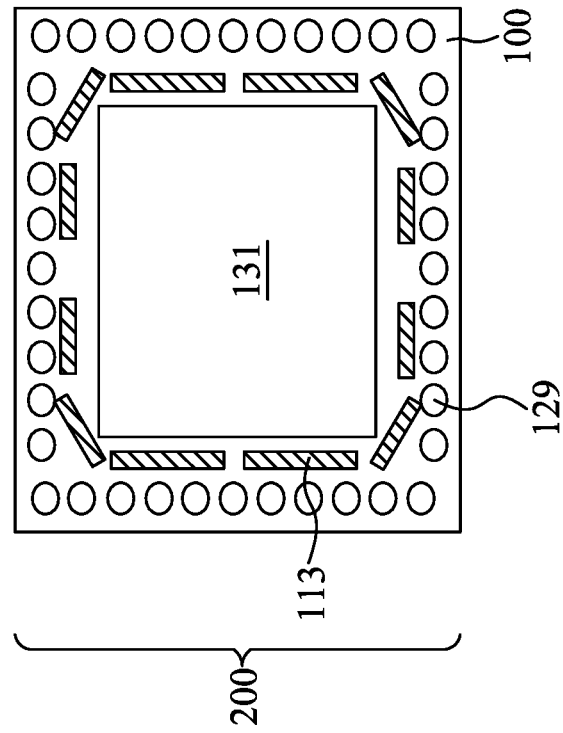
FIGS. 2(a)-2(c) illustrate top views of embodiments of a package formed on an interposer with a dam or multiple dams.
Figure 2A:
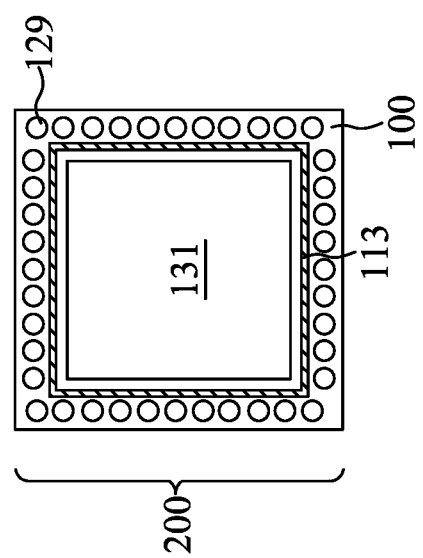
Figure 2C:
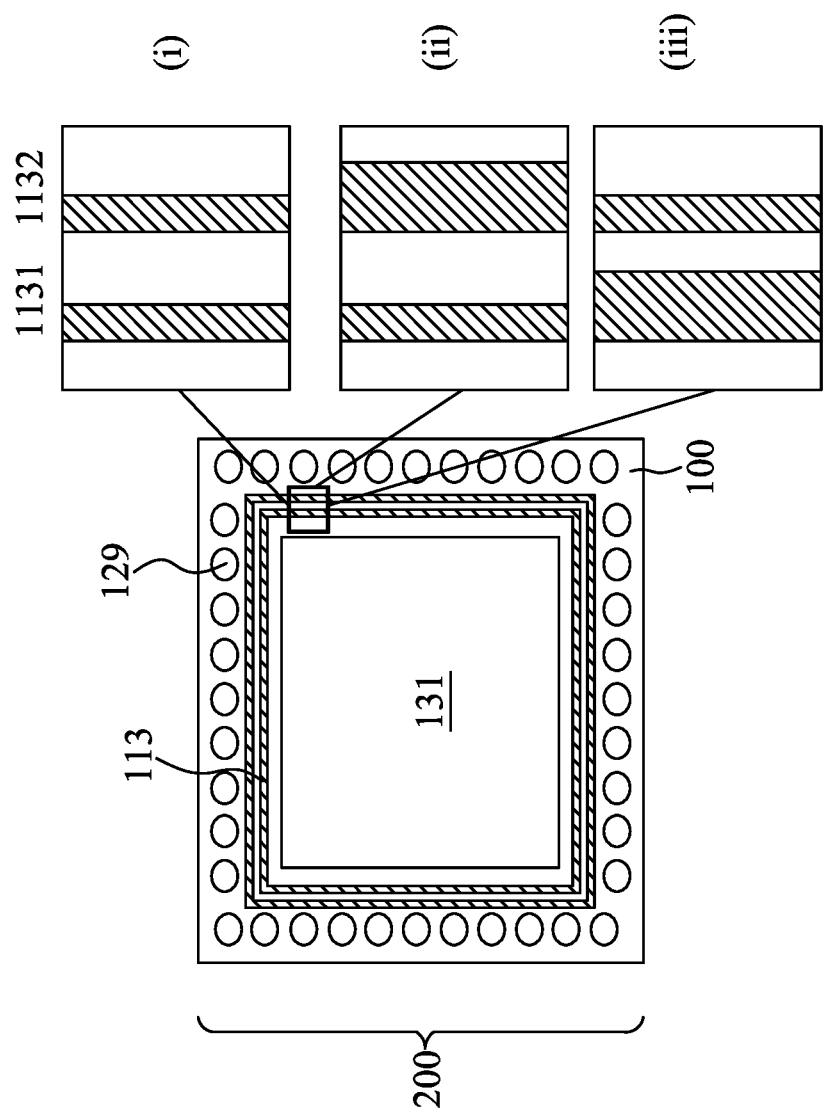

FIGS. 2(a)-2(c) illustrate top views of embodiments of packages on interposer 100 with the dam 113. FIG. 2(a) is a top view of the package 200 shown in FIG. 1(b), where a die 131 is placed on top of the interposer 100. The die 113 may be packaged with the interposer 100 using a variety of technologies, such as a flip-chip wafer level package technology as shown in FIG. 1(b), or using a wire bonding technique, or using a flip-chip and bump-on-trace technique, which are not shown. A plurality of connectors 129 is formed on the interposer 100.

As illustrated in FIG. 2(a), the dam 113 surrounds the die 131 in top view, where the dam 113 forms a continuous line surrounding the die 131. The two dam segments 113 shown in FIG. 1(a) is a cross-section view of the dam 113 shown in FIG. 2(a). Other form of dam embodiments may be formed. As illustrated in FIG. 2(b), a plurality of dam segments 113 may be formed to surround the die 113, but the dam 113 is discontinuous comprising a plurality of broken segments.

Furthermore, there may be multiple dams 113 formed to surround the die 131, as shown in FIG. 2(c). There are two dams 1131 and 1132 surrounding the die 131, where the dam 1131 and 1132 are continuous and encircle the die 131. The width of the dams 1131 and 1132 may be the same as shown in part (i) or different as shown in parts (ii) and part (iii). The two dams 1131 and 1132 shown in FIG. 2(c) are only for illustration and not limiting. For example, one of the two dams or both of the two dams may comprise discontinuous segments as shown in FIG. 2(b). In addition, there may be more than two dams formed on the interposer 100.

Figure 3:
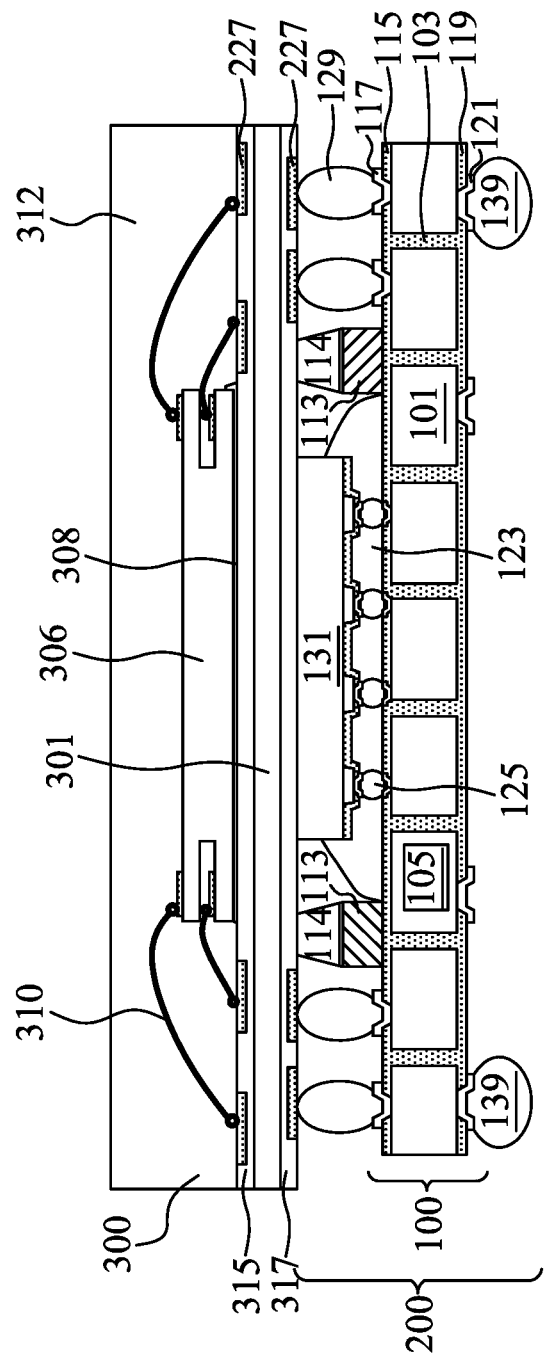
FIG. 3 illustrates an embodiment of a package on package, where a package is formed on an interposer with a dam.

FIG. 3 illustrates an embodiment of a PoP structure formed by placing a package 300 on the package 200, where the package 200 is the same package shown in FIG. 1(b). The package 300 and the package 200 may be electrically coupled to form a PoP device. A set of connectors 129 may be formed on the first contact pads 117 of the package 200 formed on the interposer 100, and further connected to a set of contact pads 227 of the package 300. The connectors 129 may be PoP connectors in some embodiments.

The package 300 may have a substrate 301. A first metal layer 317 may be formed on one side of the substrate 301 and a second metal layer 315 may be formed on another side of the substrate 301. A plurality of connectors such as contact pads 227 may be formed on the two metal layers 317 and 315. The contact pads 227 may be used to connect to another package, such as package 200 at the bottom. A first IC die 308 may be mounted on the second metal layer 315. A second IC 306 may be mounted on the first IC 308, separated by an attachment material such as a thermally conductive adhesive, to provide improved thermal conductivity between the dies. Both the first IC 308 and the second IC 306 may be connected to contact pads 227 on the second metal layer 315 using the side electrical interconnections 310. An encapsulant or mold compound 312 may cover the components such as ICs 306 and 308, the side electrical interconnections 310, the contact pads 227, and the second metal layer 315. Through vias (TVs) (not shown) may be used to provide electrical connections between the die 308 and other circuits through the substrate 301.

In an embodiment, the substrate 301 may be any suitable substrate, such as a silicon substrate, a high-density interconnect, an organic substrate, a ceramic substrate, a dielectric substrate, a laminate substrate, or the like. The dies 308 and 306 may be memory chips, such as DRAM, SRAM, or NVRAM, and/or or logic chips for a particular application. There may be a plurality of dies mounted on top of each other or on the side. The first metal layer 317 and the second metal layer 315 may be redistribution lines (RDLs). The side electrical interconnections 310 may be bond wires. The connectors 227 may comprise, for example, contact pads, lead free solder, eutectic lead, conductive pillars, combinations thereof, and/or the like.

The encapsulant or mold compound 312 may be formed over the components to protect the components from the environment and external contaminants. The encapsulant 312 may be formed from a number of materials, such as an elastomer or a rigid resin (thermoset epoxy, silicone and polyurethane), and is used to encapsulate and protect the internal stacking components from shock and vibration.

It should be understood that the above description provides a general description of embodiments and that embodiments may include numerous other features. For example, embodiments may include under bump metallization layers, passivation layers, molding compounds, additional dies and/or substrates, and the like. Additionally, the structure, placement, and positioning of the die 306 and the die 308 are provided for illustrative purposes only, and accordingly, other embodiments may utilize different structures, placements, and positions.

Thereafter, other normal processes may be followed after the completion of the formation of the PoP structure. For example, the PoP structure may be attached to a printed circuit board (PCB), a high-density interconnect, a silicon substrate, an organic substrate, a ceramic substrate, a dielectric substrate, a laminate substrate, another semiconductor package, or the like, through the connectors 139 at the package 200.

One embodiment is a method, including forming an interconnect structure above a substrate. A first contact pad and a second contact pad are deposited over and coupled to the interconnect structure, where the first contact pad is within a die attach area, and where the second contact pad is outside the die attach area. The first contact pad and second contact pad are in a same level. A first dam is deposited over the interconnect structure, the first dam including a first layer of conductive material, where the first dam laterally surrounds the die attach area, and where the first contact pad, second contact pad, and first dam are formed simultaneously.

Another embodiment is a method of forming a device including depositing a first contact pad over a substrate, where the first contact pad is coupled to a metal layer of the substrate. A first dam is deposited over the substrate, the first dam including a first layer of conductive material, where the first dam laterally surrounds a die attach area. A die is attached to the first contact pad in the die attach area. A volume of an underfill material is calculated according to a height of the first dam and space between the die and the substrate. The volume of the underfill material is deposited between the die and the substrate, where the volume of the underfill material does not exceed the height of the first dam.

Another embodiment is a structure, including a substrate. The substrate includes a die attach region, an underfill region, and a connect region, where the underfill region includes the die attach region and an area surrounding the die attach region, and where the connect region is disposed outside the underfill region. One or more through-silicon vias are disposed in the die attach region and in the connect region. The structure includes an interconnect structure disposed above the substrate. A first contact pad and a second contact pad are disposed over and coupled to the interconnect structure, where the first contact pad is disposed within the die attach region, where the second contact pad is disposed outside the die attach region, and where the second contact pad is a nearest contact pad to the die attach region. The structure includes a first dam over the interconnect structure. The first dam includes a first layer of conductive material and surrounds the underfill region. A cross-sectional width of the first dam is greater than or equal to a shortest distance between the first dam and the second contact pad. The structure also includes a die connected to the first contact pad and an underfill disposed in the underfill region, between the die and the substrate, where the underfill has a top surface lower than a top surface of the first dam.

One embodiment includes a method of forming a device. The method includes forming a metal layer above a substrate, forming a first contact pad and a second contact pad above the metal layer, and forming a first dam above the metal layer. The first dam includes a first layer of conductive material and a second layer of non-conductive material. The first dam surrounds an area having the first contact pad within the area. The second contact pad is outside the area.

Another embodiment includes a method which includes forming a redistribution layer over a substrate. A first contact pad and a second contact pad are prepared above the redistribution layer. A conductive first dam layer is deposited above the redistribution layer. The first dam layer surrounds the first contact pad. The second contact pad is outside the first dam layer surround. A non-conductive second dam layer is deposited on the first dam layer. A first die is coupled to the first contact pad. An underfill is inserted under the first die. The underfill contacts inner sides of the first dam layer and the second dam layer, where the inner sides face the first die.

Another embodiment includes a method of forming a semiconductor die that includes preparing a substrate and forming a metal layer over the substrate. A first die area is deposited over the metal layer. A second die area is deposited over the metal layer. A first dam is deposited around the first die area while depositing the first die area. The first dam is not deposited around the second die area. The first dam comprises conductive material. A second dam can be deposited on the first dam. The second dam comprises non-conductive material.

Another embodiment is a structure including an interposer, the interposer including a die attach region, an underfill region, and a connect region, where the underfill region includes the die attach region and an area surrounding the die attach region, and where the connect region is disposed outside the underfill region. The structure includes a die attached to a first contact pad in the die attach region by a first connector, and a first dam disposed on the interposer, where the first dam surrounds the underfill region. The structure also includes underfill disposed in the underfill region, the underfill surrounding the first connector. The structure further includes a package attached to the interposer by a second connector in the connect region of the interposer, a bottom surface of the package contacting a top surface of the die.

Another embodiment is a structure including an interposer, the interposer including a semiconductor layer, an interconnect structure disposed over the semiconductor layer, the interconnect structure having a first metal layer, and a first contact pad, a second contact pad, and a first dam disposed over the interconnect structure, each of which being physically coupled to the first metal layer of the interconnect structure, the first contact pad being disposed within the first dam, the second contact pad being disposed outside the first dam.

Another embodiment is a structure including a substrate, the substrate including a die attach region, an underfill region, and a connect region, where the underfill region includes the die attach region and an area surrounding the die attach region, and where the connect region is disposed outside the underfill region. The structure also includes a first contact pad and a second contact pad, where the first contact pad is disposed within the die attach region, where the second contact pad is disposed in the connect region. The structure also includes a first dam over the substrate, the first dam including a first layer of conductive material, where the first dam is disposed around the underfill region. The structure also includes a die attached to the first contact pad of the die attach region by a first connector. The structure also includes a package device attached to the second contact pad by a second connector, the package device having a bottom surface that simultaneously contacts a top surface of the die and a top surface of the first dam.

Another embodiment is a structure including a device mounting surface, the device mounting surface including a die attach region, an underfill region, and a connect region, where the underfill region includes the die attach region and an area surrounding the die attach region, and where the connect region is disposed outside the underfill region. The structure also includes a die attached to a first contact pad in the die attach region by a first connector. The structure also includes a first dam disposed on the device mounting surface, where the first dam is disposed around the underfill region, the first dam including a first layer of a conductive material and a second layer over the first layer. The structure also includes underfill disposed in the underfill region, the underfill surrounding the first connector. The structure also includes a package attached to the device mounting surface by a second connector in the connect region of the device mounting surface, a bottom surface of the package contacting a top surface of the first dam.

Another embodiment is a structure including an interconnect structure disposed over a semiconductor layer, the interconnect structure including a first metal layer embedded in an insulating material layer. The structure also includes a first dam disposed over the interconnect structure and around a die attach area, the first dam being physically coupled to the first metal layer of the interconnect structure.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a substrate, the substrate comprising a die attach region, an underfill region, and a connect region, wherein the underfill region includes the die attach region and an area surrounding the die attach region, and wherein the connect region is disposed outside the underfill region, the substrate comprising a conductive feature;
   a first contact pad and a second contact pad, wherein the first contact pad is disposed within the die attach region, wherein the second contact pad is disposed in the connect region;
   a first dam over the substrate, the first dam comprising a first layer of conductive material directly contacting the conductive feature, wherein the first dam is disposed around the underfill region;
   a die attached to the first contact pad of the die attach region by a first connector, wherein the first dam is isolated from circuitry of the die; and
   a package device attached to the second contact pad by a second connector, the package device having a bottom surface that simultaneously contacts a top surface of the die and a top surface of the first dam.

2. The structure of claim 1, further comprising:
   an interconnect structure over the substrate, the first contact pad and second contact pad coupled to the interconnect structure.

3. The structure of claim 1, further comprising:
   a second dam adjacent to and laterally separated from the first dam.

4. The structure of claim 3, wherein a cross-sectional width of the second dam is different than a cross-sectional width of the first dam.

5. The structure of claim 1, further comprising:
   an underfill disposed in the die attach region, the underfill being interposed between the die and the substrate, wherein the underfill has an upper surface having a first vertical extent less than a second vertical extent of the first dam.

6. The structure of claim 1, further comprising a solder connector disposed on the second contact pad, the solder connector having a vertical extent greater than a vertical extent of the first layer of the first dam.

7. The structure of claim 6, wherein a cross-sectional height or a cross-sectional width of the first dam is the same as a diameter of the solder connector.

8. A structure comprising:
   a device mounting surface, the device mounting surface comprising a die attach region, an underfill region, and a connect region, wherein the underfill region includes the die attach region and an area surrounding the die attach region, wherein the device mounting surface includes a conductive feature, and wherein the connect region is disposed outside the underfill region;
   a die attached to a first contact pad in the die attach region by a first connector;
   a first dam disposed on the device mounting surface, wherein the first dam is disposed around the underfill region, the first dam comprising a first layer of a conductive material and a second layer over the first layer, wherein the second layer comprises an organic dielectric material, wherein the first layer of the conductive material directly contacts the conductive feature of the device mounting surface;
   underfill disposed in the underfill region, the underfill surrounding the first connector; and
   a package attached to the device mounting surface by a second connector in the connect region of the device mounting surface, a bottom surface of the package contacting a top surface of the first dam.

9. The structure of claim 8, wherein the first layer of the first dam has a same material composition as the first contact pad.

10. The structure of claim 8, wherein the underfill has an upper surface which is higher than an upper surface of the first layer of the first dam.

11. The structure of claim 8, wherein a cross-sectional width of the first dam is greater than or equal to a shortest distance between the first dam and the second connector.

12. The structure of claim 8, further comprising:
an embedded device; and
an interconnect electrically coupling the second connector to the embedded device.

13. The structure of claim 8, wherein the first connector is a closest connector to the first dam in the die attach region, wherein the second connector is a closest connector to the first dam in the connect region, wherein a first distance between the first connector and the first dam is greater than a second distance between the second connector and the first dam.

14. The structure of claim 13, wherein the first distance is between 8.5 and 19 times the second distance.

15. A structure comprising:
an interconnect structure disposed over a semiconductor layer, the interconnect structure comprising a first metal layer embedded in an insulating material layer; and
a first dam disposed over the interconnect structure and around a die attach area, the first dam comprising a conductive layer physically coupled to the first metal layer of the interconnect structure, wherein the first dam comprises a conductive material layer and a non-conductive material layer disposed over the conductive material layer, and wherein an entire bottom surface of the non-conductive material layer is covered by a top surface of the conductive material layer.

16. The structure of claim 15, further comprising a first contact pad disposed in the die attach area, the first contact pad and the first dam comprising a same material composition.

17. The structure of claim 15, wherein the first dam comprises a plurality of discontinuous segments disposed around the die attach area.

18. The structure of claim 17, wherein a first segment of the first dam is parallel to a first edge of the die attach area, wherein a second segment of the first dam is parallel to a second edge of the die attach area, the first segment perpendicular to the second segment in a plan view, and wherein a third segment of the first dam is neither parallel to nor perpendicular to the first segment or the second segment.

19. The structure of claim 15, further comprising:
a second contact pad coupled to the interconnect structure, the second contact pad outside the die attach area; and
a package attached to the second contact pad by a second connector, wherein a bottom surface of the package contacts an upper surface of the first dam.

20. The structure of claim 15, wherein the non-conductive material layer comprises a polymer.

* * * * *